(12) United States Patent
Barr et al.

(10) Patent No.: US 6,344,698 B2
(45) Date of Patent: *Feb. 5, 2002

(54) MORE ROBUST ALIGNMENT MARK DESIGN

(75) Inventors: Roger Lawrence Barr, Milton; Robert Truman Froebel, Fairfax; Paul Sonntag, Colchester, all of VT (US)

(73) Assignee: International Business Machines Corporation, Armonk, NY (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/253,864

(22) Filed: Feb. 22, 1999

(51) Int. Cl.⁷ .............................................. H01L 23/544
(52) U.S. Cl. ...................................................... 257/797
(58) Field of Search ......................................... 257/797

(56) References Cited

U.S. PATENT DOCUMENTS

| | | | | |
|---|---|---|---|---|
| 4,848,911 A | * | 7/1989 | Uchida et al. | 257/797 |
| 6,046,508 A | * | 4/2000 | Miyatake | 257/797 |

* cited by examiner

Primary Examiner—Gene M. Munson
(74) Attorney, Agent, or Firm—Scully, Scott, Murphy & Presser; William D. Sabo

(57) ABSTRACT

Robust alignment marks which are substantially resistant to degradation caused by semiconductor device fabrication steps are disclosed. The new alignment marks use a series of geometrical shapes that are staggered in respect to each other to achieve more left and right edges providing a checkerboard alignment mark. The geometrical shapes have a size that is selected so as to be within the resolving capability of the exposure tool, yet smaller than the resolving capability of the alignment system. The small staggered geometrical shapes provide a more symmetrical signal which is more resistant to variability in prior processing steps than the standard mark design.

9 Claims, 5 Drawing Sheets

MORE ROBUST ALIGNMENT MARK DESIGN

DESCRIPTION

1. Field of the Invention

The present invention relates to robust alignment marks and, in particular, to alignment marks which improve the accuracy of an alignment during the manufacturing of a semiconductor device. The improved accuracy is achieved in the present invention by providing alignment mark designs which enhance the symmetrical signals emitting from asymmetric microstructures. Moreover, the alignment marks of the present invention are highly resistant to damages caused by semiconductor processing steps used in manufacturing semiconductor devices thus improving the reliability and accuracy of the alignment process.

2. Background of the Invention

In very large scale integration (VLSI) photolithographic processes, a mask comprising a desired circuit pattern must be precisely aligned with a semiconductor wafer, or with a pattern previously formed on the wafer, in order to ensure proper placement of the projected image. Moreover, in order to increase integration density, VLSI chips typically employ multiple layers formed by successive image projection steps. In the photofabrication of such multilayer semiconductor devices, the precise registry of the successive images is extremely critical.

Measurement overlays are generally employed in the prior art to confirm that successively projected circuit patterns have been positioned accurately with respect to each other. To obtain the necessary mask to wafer alignment, marks are placed in the peripheral regions of the mask and the wafer respectively. These marks are detected by a photo-optical detector of the exposure tool. A precision alignment system is then used to measure relative positions of the wafer and mark such that the current level is exposed in the correct position relative to the prior level.

Numerous alignment marks are known in the prior art which have a variety of shapes, patterns and configurations. The exact design of a prior art alignment mark is oftentimes dependent on the photo-optical detection system being used. Examples of some prior art alignment marks are found, for instance, in U.S. Pat. No. 5,601,957 to Mizutani, et al.; U.S. Pat. No. 5,702,567 to Mitsui, et al.; 5,760,484 to Lee, et al.; 5,777,392 to Fujii; and 5,808,742 to Everett, et al.

Typically, prior art alignment marks, such as those described in the above patents, comprise a set of long, narrow trenches or lines which are placed a significant distance apart (10 microns or greater). One such prior art alignment mark is shown in FIGS. 1(a)–(b). Specifically, FIG. 1(a) comprises a prior art fine alignment mark. This prior art fine alignment mark of a set of parallel trenches, i.e. lines, which are spaced apart by a great distance. The parallel lines are placed on the wafer or mask on a 45° angle. FIG. 1(b), on the other hand, shows a prior art intermediate alignment mark consisting of two sets of parallel trenches that crisscross each other to form a "X" shaped design. As is known to those skilled in the art, the intermediate alignment marks are employed to provide a course alignment of the image or pattern, whereas the fine alignment mark is used for greater alignment precision.

Another type of alignment mark design currently being employed in semiconductor manufacturing is shown in FIG. 2. Specifically, the alignment mark of FIG. 2 comprises a set of long, narrow trenches or lines that are arranged in a 90° orientation.

One major problem with prior art alignment marks of the kind illustrated above is that some of the processing steps employed in fabricating the semiconductor device, such as chemical mechanical polishing (CMP) or grinding, damage the alignment marks so that the alignment/exposure tool either can't detect the mark or it detects a distorted image so the measured position is incorrect. This results in misalignment of the various layers of the structure causing the need to repeat the various processing steps. This misalignment increases cost as well as processing times.

Another problem with prior art alignment marks is that, if the alignment mark is damaged during processing, the signal generated from these asymmetric microstructures may not be totally symmetrical. Thus, alignment marks of the prior art oftentimes provide an asymmetrical signal which reduces the detection capability of the prior art alignment marks.

There is thus a need for developing new alignment marks which are more robust than existing alignment marks currently being employed. Specifically, new alignment marks are needed which are substantially resistant to damages caused during the production of a semiconductor device. Such alignment marks will be beneficial in the semiconductor industry since they will lower the production cost and time required for fabrication of an individual semiconductor device, e.g. integrated circuit, transistor, etc. Moreover, new alignment marks are needed which substantially eliminate the asymmetric signal which can be generated by such microstructures.

SUMMARY OF THE INVENTION

The present invention provides new alignment mark designs that are robust. The term "robust" is used herein to denote an alignment mark which is substantially resistant to damages caused during device manufacturing. The robust nature of the alignment marks of the present application allows for easier detect and better alignment of the circuit pattern on the wafer. It is noted that the term "alignment mark" as used herein refers to intermediate or global alignment marks as well as fine alignment marks.

In accordance with one embodiment of the present invention, the alignment mark comprises a set of geometrical defined shapes, i.e. images, that are staggered in a checkerboard configuration to achieve more left and right line edges in a small space. The size of the geometrical images used in the checkerboard arrangement is chosen to be within the resolving capability of the exposure tool, so that the shapes can be printed. The shape size is however smaller than the resolving capability of the alignment system resulting in the alignment system's detector seeing only one overall image from the series of edges. The small staggered checkerboard images provide a strong, robust signal which is more resistant to variability in prior processing steps than the prior art alignment marks which utilize a set of long, narrow trenches placed a significant distance apart.

The term "checkerboard" is used herein to denote a configuration (elongated, square, rectangular, circular, etc.) wherein geometrical defined shapes such as squares, triangles, circles, diamonds and other like shapes, are arranged in a pattern such that the shapes are staggered and spaced apart from each other. This arrangement provides a blend of left and right edges which generates more symmetrically aligned signals than heretofore possible with prior art alignment marks.

Another embodiment of the present invention is to modify the outermost edges of the checkerboard-containing alignment mark described hereinabove so that the same are not visible to the alignment detector. This results in alignment system seeing the same number of left vs. right edges in a single scan which will reduce the effects of differential edge damage by prior level processing steps. The edge structure of the alignment marks of the present invention can be changed in various ways. On variation employed in the present invention is to change from an edge of a bar to two edges of a triangle.

In any of the above embodiments, the prior art problem identified in the background section of the application has been overcome by providing a series of closely spaced smaller images, rather than one large image. The smaller images are less susceptible to polish damage, and the proximity of other small images makes them even more resistant to polish damage. In addition, alignment will be more robust because each mark of the present application provides multiple edges for the detectors and the size is chosen to provide the same signal from the detector that the system handles.

The present invention also provides a method of enhancing the symmetrical signals emitting from an alignment mark. In accordance with this aspect of the present invention, an alignment mark having a set of geometrical shapes which are staggered in respect to each other so as to achieve additional left and right line edges in a small space and being arranged in a checkerboard configuration, wherein said geometrical shapes have a size that is within the resolving capability of an exposure tool so that the geometrical shapes can be printed, yet the size of said shapes is smaller than the alignment tool's detector resolving capability resulting in the detector seeing only one overall image from the edges is provided and this mark is then scanned using a conventional exposure or alignment tool.

DESCRIPTION OF THE INVENTION

Figure 1A:
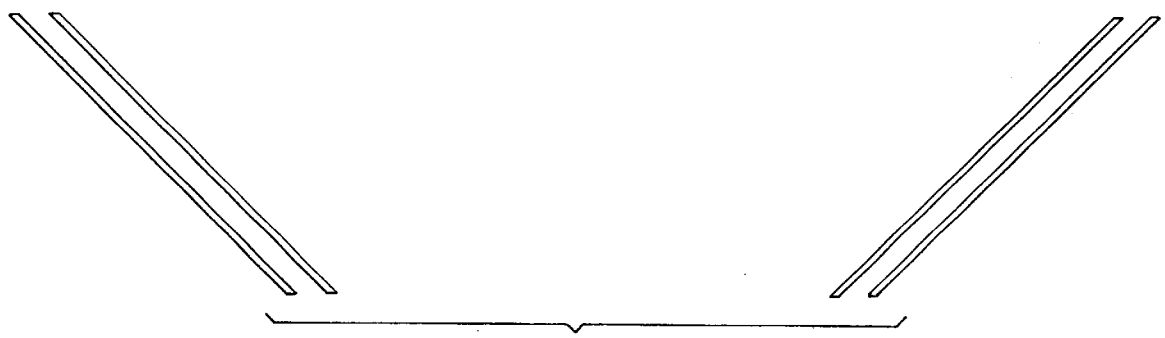
FIGS. 1(a)–(b) are prior art alignment marks that are currently being used in manufacturing semiconductor devices; (a) fine alignment mark; and (b) intermediate alignment mark.
Figure 1B:
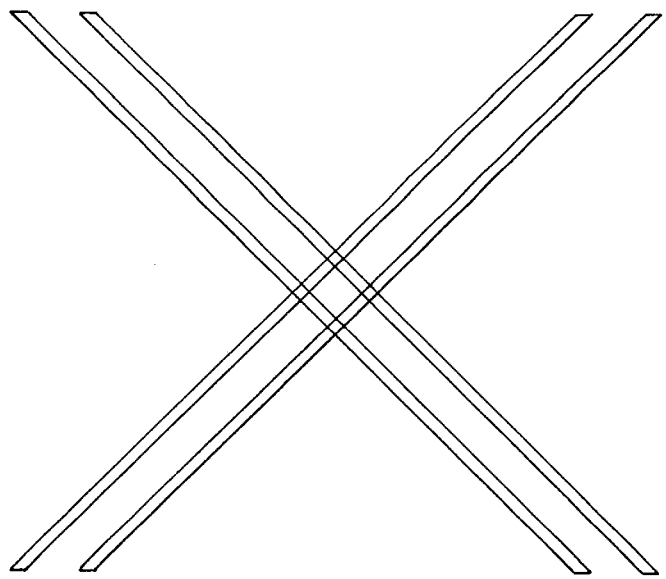
Figure 2:
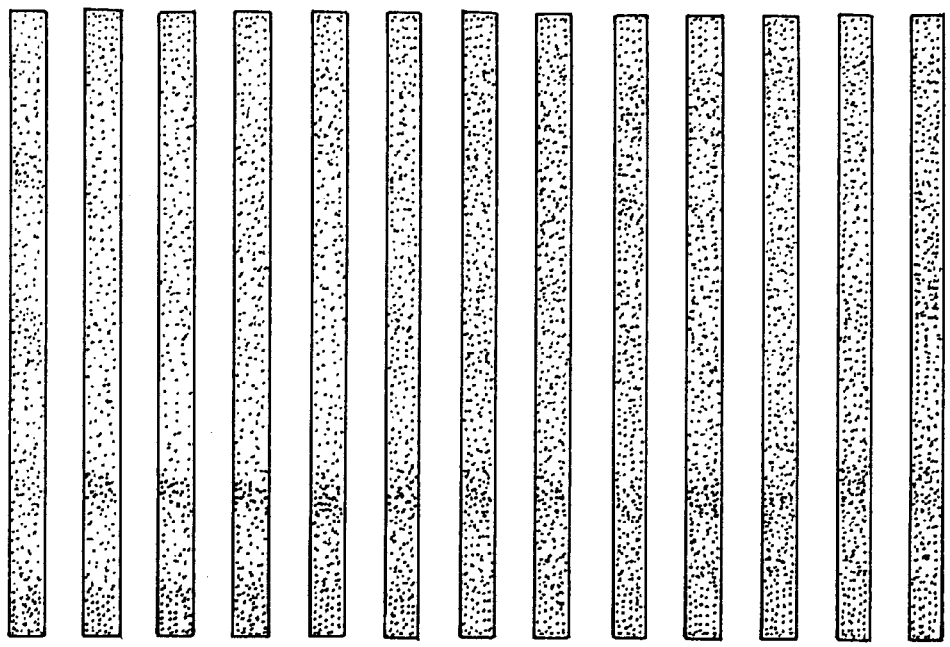
FIG. 2 is another prior art alignment mark wherein the set of lines are in a 90° orientation.

The present invention, which provides new alignment mark designs that are more robust than prior art alignment mark designs, will now be described in more detailed by referring to the drawings that accompany this application. It is noted that like reference numerals are used in the drawings for describing like and corresponding elements.

It is emphasized that the alignment marks of the present invention are used in the conventional manner, i.e. they are placed on peripheral regions of the mask and the wafer respectively using conventional techniques well known to those skilled in the art. Moreover, the alignment marks of the present invention can be used with conventional exposure/alignment tools that are presently being used in the field of semiconductor manufacturing without any tool modification. Additionally, the alignment marks of the present invention are produced using conventional procedures that are also well known to those skilled in the art. The novelty of the invention thus resides in the mark design itself, not in any of the above mentioned areas.

Figure 3A:
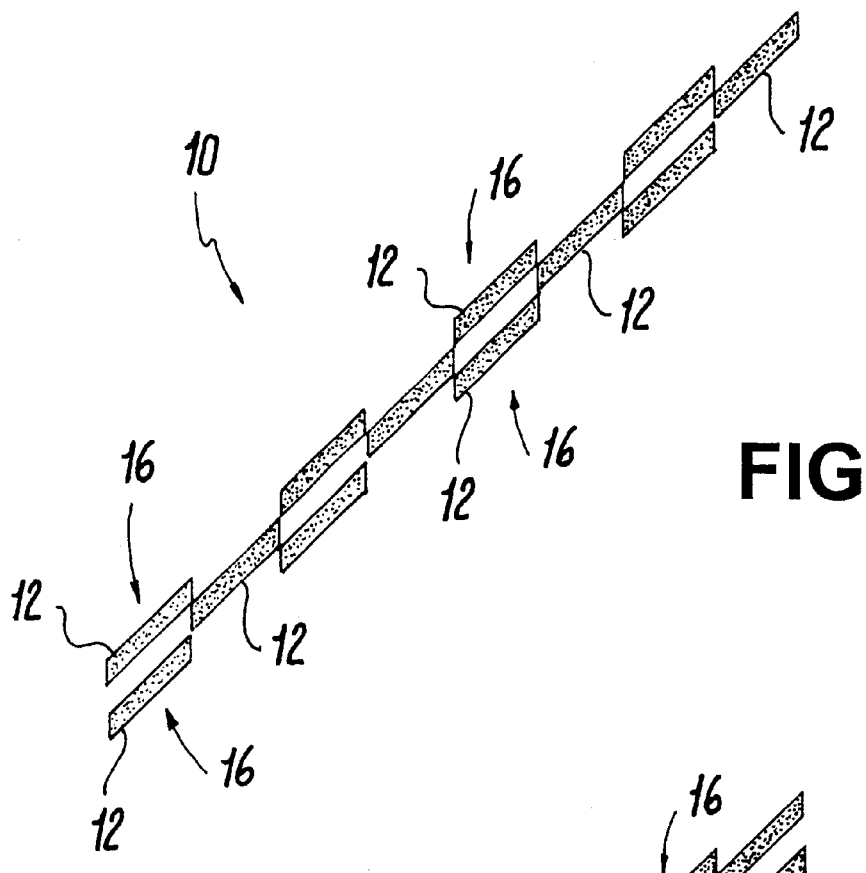
FIGS. 3(a)–(b) illustrate alignment marks of the present invention wherein the long, narrow trenches of prior art alignment marks have been replaced with a set of small, nested lines aligned in a checkerboard fashion so as to achieve a blend of left and right line edges.
Figure 3B:
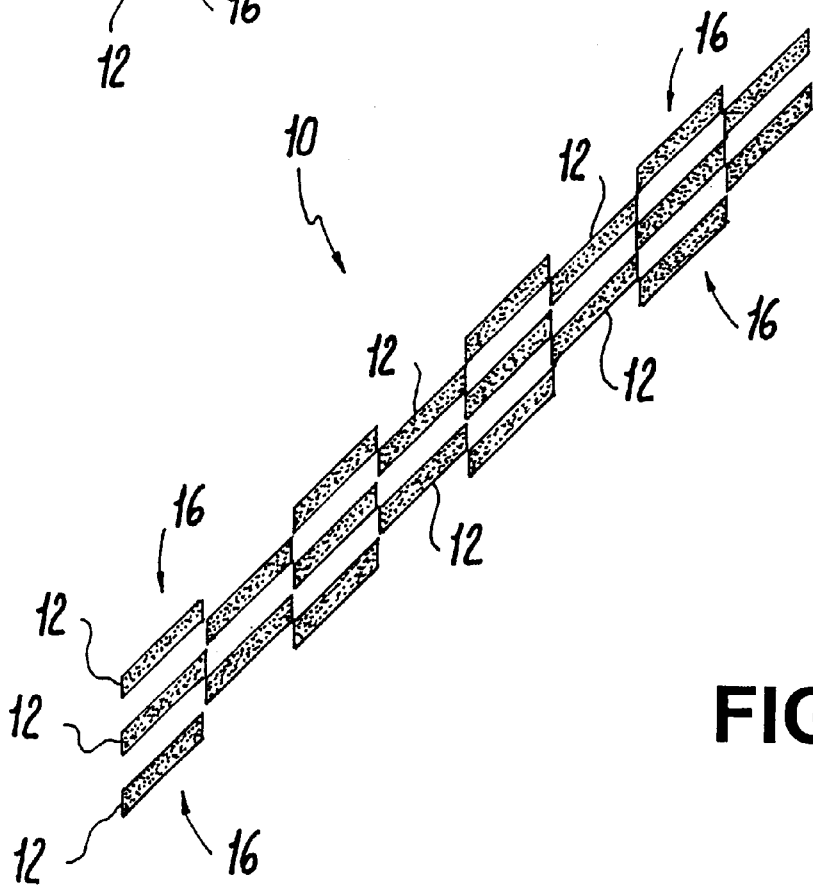
Figure 5:
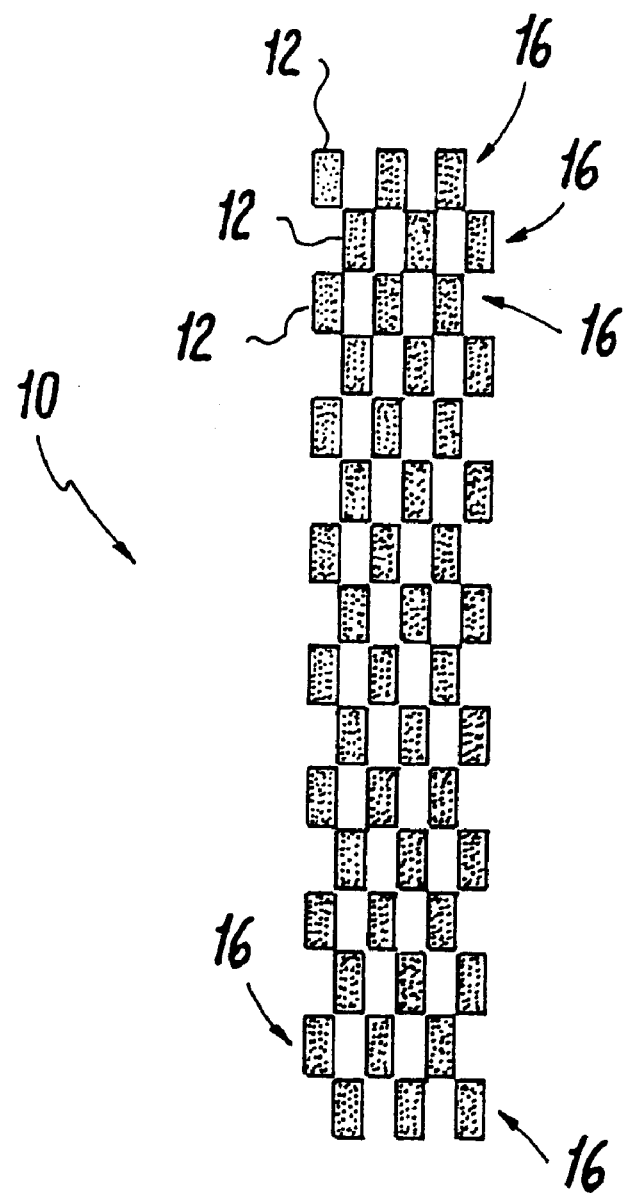
FIG. 5 is an illustration of another alignment mark of the present invention wherein the set of geometric shapes are arranged in a 90° orientation.

In accordance with one embodiment of the present invention, the alignment mark 10 of the present invention comprises a set of nested lines 12 separated by small spaces, wherein said nested lines are staggered in respect to each other so as to achieve additional left and right line edges 16, in a small space (sub-micron to 16 microns). Alignment marks of this kind, which are representative of the present invention, are illustrated in FIGS. 3(a)–(b) and FIG. 5.

The alignment mark design may use other geometrical shapes in place of the nested lines. For example, squares, triangles, circles, diamonds and other like shapes which are capable of being arranged in a checkerboard fashion and being detected by the exposure/alignment tools can be employed in the present invention. Combinations of more than one geometrical shape are also contemplated herein.

The orientation of the geometrical shapes may vary depending on the alignment system being used. For example, the set of geometrical shapes could be arranged at a 45° (see FIGS. 3(a)–(b) and 4(a)–(b)) or 90° orientation (see FIG. 5).

The alignment marks of the present invention are incorporated into a wafer or in a mask in place of the prior art alignment marks using conventional processes well known to those skilled in the art. The mask is composed of any suitable material including: metal, silicon or dielectric. In the drawings, the mask and wafer are not shown therein.

The wafer is composed of a semiconducting material such as Si, SiGe, InP or other III/V compounds, a dielectric layer, a metal layer or any other layer that could be present in a semiconductor device.

It is noted that the aspect ratio of the individual shape segments of the alignment marks of the present invention is not fixed. Instead, the aspect ratio of the individual segments of the alignment marks of the present invention change depending on the photolithiographic tool being used, the imaging ground rules of the product being fabricated and the exact fabrication process being used in manufacturing the integrated circuit.

The geometrical shapes of the alignment marks of the present invention have a size that is within the resolving capability of the exposure tool so that the shapes can be printed, yet the size of the shape is smaller than the alignment tool's detector resolving capability resulting in the detector seeing only one overall image from the edges. Typically, in one embodiment of the present invention, the length of the geometrical shapes of the alignment mark of the present invention is from about 1 to about 10 microns. More preferably, the length of the geometrical shapes of the checkerboard alignment marks of the present invention is from about 1.5 to about 3 microns.

The width, w, between each geometrical shapes of the checkerboard alignment mark of the present invention varies depending on the exact configuration of the mark design. The width of the overall sum of the shapes must however be sufficiently large enough to be detected by the alignment detector employed. Typically, the width between adjacent shapes is from about 0.3 to about 1micron. More preferably, the width between adjacent shapes is from about 0.4 to about 0.6 microns.

Figure 4A:
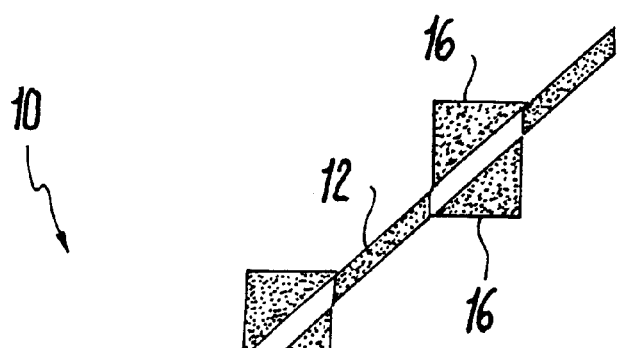
FIGS. 4(a)–(b) illustrate alternative alignment marks of the present invention wherein the bar edges shown in FIGS. 3(a)–(b) have been modified into triangular edges.
Figure 4B:
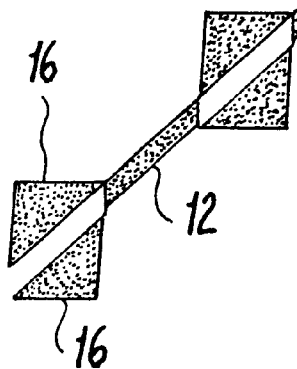
Figure 4B:
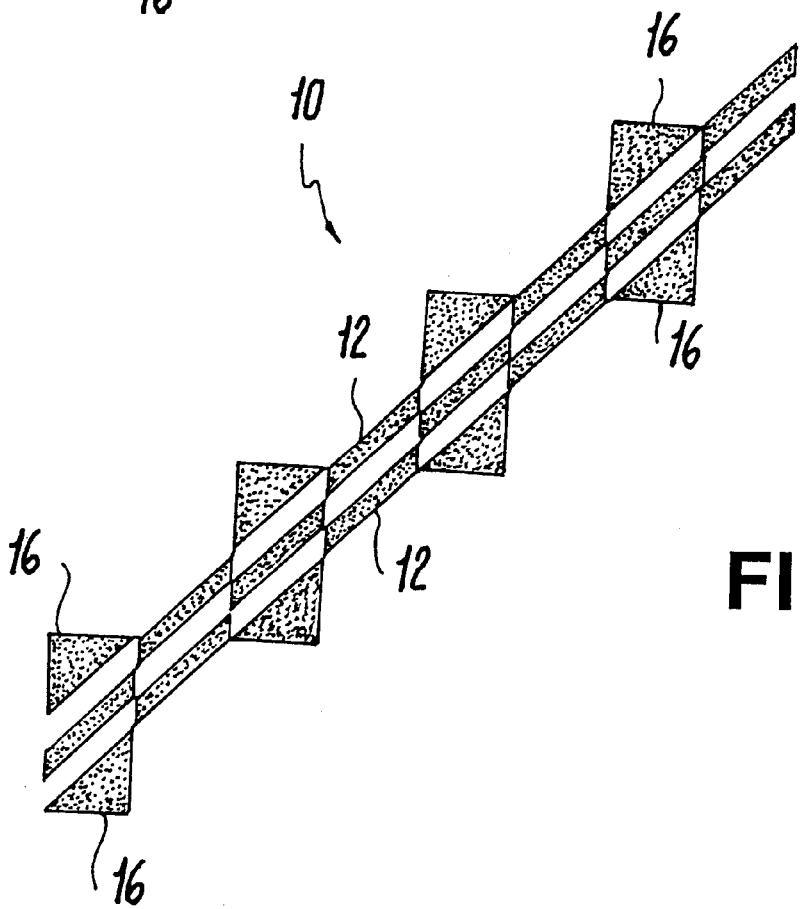

FIGS. 4(a)–(b) show another embodiment of the present invention. In this embodiment, the outermost edges 16 of the line-containing alignment marks shown in FIGS. 3(a)–(b) are modified so that the same are not visible to the alignment detector. This results in the alignment system seeing the same number of left vs. right edges at any one particular scan cycle which will reduce the effects of differential edge damage caused by prior level processing steps. The edge structure can be changed in various ways. On variation employed herein is to change from an edge of a bar to two edges of a triangle. Another way includes a saw-tooth configuration.

In any of the above embodiments, the prior art problem has been substantially eliminated by providing a series of closely spaced smaller images (shapes), rather than one larger image (line). The smaller shapes of the alignment marks of the present invention are less susceptible to polish damage, and the proximity of other small images makes them even more resistant to polish damage.

In addition, alignment of the circuit patterns on the wafer will be more robust using the alignment marks of the present invention because each mark provides multiple edges for the detectors and the size is carefully selected to provide the same type of signal from the detector that the system handles.

While the invention has been particularly shown and described with respect to preferred embodiments thereof, it will be understood by those skilled in the art that the foregoing and other changes in form and details may be made without departing from the spirit and scope of the present invention.

Having thus described our invention in detail, what we claim as new, and desire to secure by the Letters Patent is:

1. A robust alignment mark for use with exposure/alignment tools for improving the alignment accuracy, said alignment mark comprising: a set of geometrical shapes present on peripheral regions of a mask and wafer which are staggered in respect to each other so as to achieve additional left and right line edges in a small space and being arranged in a checkerboard configuration, wherein said geometrical shapes have outermost edges that are not visible to a detector and a size that is within the resolving capability of the exposure tool so that the geometrical shapes can be printed, yet the size of said shapes is smaller than the alignment tool's detector resolving capability resulting in the detector seeing only one overall image from the edges, said set of geometric shapes enhancing symmetrically aligned signals emitting from an asymmetric microstructure and being resistant to damages caused by subsequent semiconductor processing steps.

2. The robust alignment mark of claim 1 wherein said geometrical shapes are nested lines, triangles, squares, circles, diamonds, or combinations thereof.

3. The robust alignment mark of claim 2 wherein said geometrical shape is a nested line or a triangular.

4. The robust alignment mark of claim 1 wherein said geometrical shapes have a length of from about 1 to about 10 microns.

5. The robust alignment mark of claim 4 wherein said geometrical shapes have a length of from about 1.5 to about 3.0 microns.

6. The robust alignment mark of claim 1 wherein said geometrical shapes are spaced apart by a width of from about 0.3 to about 1 micron.

7. The robust alignment mark of claim 6 wherein said geometrical shapes are spaced apart by a width of from about 0.4 to about 0.6 microns.

8. The robust alignment mark of claim 1 wherein said geometrical shapes are oriented at 45° or 90° relative to each other.

9. A method comprising: forming on peripheral regions of a mask and wafer an alignment mark having a set of geometrical shapes which are staggered in respect to each other so as to achieve additional left and right line edges in a small space and being arranged in a checkerboard configuration, wherein said geometrical shapes have outermost edges that are not visible to a detector and a size that is within the resolving capability of an exposure tool so that the geometrical shapes can be printed, yet the size of said shapes is smaller than the alignment tool's detector resolving capability resulting in the detector seeing only one overall image from the edges, and scanning said alignment mark using an exposure or alignment tool, wherein said set of geometric shapes enhancing symmetrically aligned signals emitting from an asymmetric microstructure and being resistant to damages caused by subsequent semiconductor processing steps.

\* \* \* \* \*